US012008833B2

(12) United States Patent
Liu et al.

(10) Patent No.: US 12,008,833 B2
(45) Date of Patent: Jun. 11, 2024

(54) CAPACITIVE FINGERPRINT IDENTIFICATION APPARATUS, PREPARATION METHOD AND ELECTRONIC DEVICE

(71) Applicant: SHENZHEN GOODIX TECHNOLOGY CO., LTD., Guangdong (CN)

(72) Inventors: Xiangying Liu, Guangdong (CN); Xiaofeng Duan, Guangdong (CN)

(73) Assignee: SHENZHEN GOODIX TECHNOLOGY CO., LTD., Guangdong (CN)

( * ) Notice: Subject to any disclaimer, the term of this patent is extended or adjusted under 35 U.S.C. 154(b) by 15 days.

(21) Appl. No.: 17/869,887

(22) Filed: Jul. 21, 2022

(65) Prior Publication Data

US 2022/0375249 A1 Nov. 24, 2022

Related U.S. Application Data

(63) Continuation of application No. PCT/CN2020/113657, filed on Sep. 6, 2020.

(51) Int. Cl.
*G06V 40/13* (2022.01)
(52) U.S. Cl.
CPC .............. *G06V 40/1306* (2022.01)
(58) Field of Classification Search
CPC .... G06V 40/1306; H05K 1/189; H05K 3/305; H05K 3/328; H05K 3/4611; H05K 2201/10151; H05K 2201/10977
See application file for complete search history.

(56) References Cited

U.S. PATENT DOCUMENTS

| 10,831,300 | B2 | 11/2020 | Shim et al. |
| 10,867,151 | B2 | 12/2020 | Liu et al. |

(Continued)

FOREIGN PATENT DOCUMENTS

| CN | 104182737 A | 12/2014 |
| CN | 104182739 A | 12/2014 |

(Continued)

OTHER PUBLICATIONS

International Search Report dated Jun. 15, 2021 issued in PCT/CN2020/113657.

*Primary Examiner* — Stephen G Sherman
(74) *Attorney, Agent, or Firm* — Scully, Scott, Murphy & Presser, P.C.

(57) ABSTRACT

A capacitive fingerprint identification apparatus, a preparation method and an electronic device can improve the performance of a capacitive fingerprint apparatus and the users' using experience. The capacitive fingerprint identification apparatus is configured to be provided on an arc-shaped surface of the electronic device, including: a capacitive fingerprint identification package structure; an arc surface structure, including a first surface and a second surface, where the first surface of the arc surface structure is a plane, the second surface of the arc surface structure is an arc surface. Setting the arc surface structure on the capacitive fingerprint identification apparatus can not only make itself and the electronic device where it is located more aesthetical in appearance and have a more three-dimensional sense, but also protect the electronic device when the electronic device is dropped, so the influence on the capacitive fingerprint identification apparatus is small.

14 Claims, 11 Drawing Sheets

(56) References Cited

U.S. PATENT DOCUMENTS

| | | | |
|---|---|---|---|
| 2015/0071510 A1* | 3/2015 | Kim | G06V 40/1306 |
| | | | 382/124 |
| 2016/0224817 A1* | 8/2016 | Yang | G06F 1/163 |
| 2019/0095004 A1* | 3/2019 | Son | H01L 23/31 |
| 2019/0250752 A1 | 8/2019 | Shim et al. | |
| 2019/0325187 A1 | 10/2019 | Liu et al. | |

FOREIGN PATENT DOCUMENTS

| | | | |
|---|---|---|---|
| CN | 104916549 A | 9/2015 | |
| CN | 105760014 A | 7/2016 | |
| CN | 108388404 A | 8/2018 | |
| CN | 108416339 A | 8/2018 | |
| CN | 109585596 A | 4/2019 | |
| CN | 110674686 A | 1/2020 | |
| CN | 211409086 U | 9/2020 | |
| WO | WO-03049012 A2 * | 6/2003 | G06K 9/0002 |

\* cited by examiner (a)

(b)

(c)

CAPACITIVE FINGERPRINT IDENTIFICATION APPARATUS, PREPARATION METHOD AND ELECTRONIC DEVICE

CROSS-REFERENCE TO RELATED APPLICATIONS

This application is a continuation of International Application No. PCT/CN2020/113657, filed on Sep. 6, 2020, the disclosure of which is hereby incorporated by reference in its entirety.

TECHNICAL FIELD

The present application relates to the technical field of fingerprint identification, and more particularly, to a capacitive fingerprint identification apparatus, a preparation method and an electronic device.

BACKGROUND

Currently, with the development of the biometric sensor, especially the rapid development of the fingerprint identification sensor, the fingerprint identification sensor is widely used in the mobile terminal device, the smart home, the automotive electronics and other fields. As time goes by, the market demand for the biometric sensor is growing, and the market demand volume is getting large. User requirements for products are not only the pursuit of high quality and high performance, but have expanded to the diversification of appearance requirements, and the aesthetic visions of different user groups are also diversified.

Currently, the capacitive fingerprint apparatuses in the mainstream market are all plane structures, which are relatively simple in appearance, have no three-dimensional sense, and the customer experience is not novel enough. In addition, dust and other substances are often easily adsorbed on the plane capacitive fingerprint apparatus, resulting in problems such as misjudgment of fingerprint identification. When the mobile phone is dropped, it will cause damage to the plane of the entire capacitive fingerprint identification apparatus, influencing the performance of the fingerprint identification apparatus.

Therefore, how to improve the performance of the capacitive fingerprint apparatus and improve the users' using experience becomes an urgent problem to be solved.

SUMMARY

An embodiment of the present application provides a capacitive fingerprint identification apparatus, a preparation method and an electronic device, which can improve the performance of the capacitive fingerprint apparatus and the users' using experience.

In a first aspect, provided is a capacitive fingerprint identification apparatus, configured to be provided on an arc-shaped surface of an electronic device, including:
 a capacitive fingerprint identification package structure;
 an arc surface structure, including a first surface and a second surface, where the first surface of the arc surface structure is a plane, the second surface of the arc surface structure is an arc surface, and the first surface of the arc surface structure is connected to a first surface of the capacitive fingerprint identification package structure, and the first surface of the capacitive fingerprint identification package structure is a side facing the outside of the electronic device.

The embodiment of the present application provides a capacitive fingerprint identification apparatus with a new structure, which has an arc surface structure. It can not only make itself and the electronic device where it is located more aesthetical in appearance, and have a more three-dimensional sense, bringing a brand new sense of sight to the user group. In addition, it may protect the electronic device. When the electronic device is dropped, the contact with the capacitive fingerprint identification apparatus is a point instead of a surface, so the influence on the capacitive fingerprint identification apparatus is small, and the arc surface design also acts as a buffer when the electronic device falls. In addition, dust and others are also difficult to be adsorbed on the arc-shaped surface of the capacitive fingerprint identification apparatus, and the interference to fingerprint identification is small. Therefore, the capacitive fingerprint identification apparatus in the embodiment of the present application has the higher fingerprint identification performance, and can improve the users' using experience.

In a possible implementation manner, the capacitive fingerprint identification package structure includes: a capacitive fingerprint sensor, a first substrate, an electrical connector and a packaging material layer;
 the capacitive fingerprint sensor is connected to the first substrate through the electrical connector; and
 the packaging material layer covers the capacitive fingerprint sensor and the electrical connector, and is connected to the first substrate.

In a possible implementation manner, the maximum distance between the second surface of the arc surface structure and the capacitive fingerprint sensor is less than or equal to a first preset threshold, so that a fingerprint capacitance value detected by the capacitive fingerprint sensor is capable of using for fingerprint detection.

In a possible implementation manner, the first preset threshold is 250 μm.

In a possible implementation manner, the maximum distance between the second surface of the arc surface structure and the capacitive fingerprint sensor is greater than or equal to 160 μm.

In a possible implementation manner, a curvature radius of an edge area of the second surface of the arc surface structure is less than a curvature radius of a middle area of the second surface of the arc surface structure.

In a possible implementation manner, a curvature radius of the edge area of the second surface of the arc surface structure is in a range of 5 to 5.5, and the curvature radius of the edge area of the second surface of the arc surface structure is 0.2.

In a possible implementation manner, an edge area of a first surface of the packaging material layer is provided with a step structure, and a middle area of the first surface of the packaging material layer is connected to the middle area of the first surface of the arc surface structure.

In a possible implementation manner, an opening is provided in the arc-shaped surface of the electronic device, and the capacitive fingerprint identification apparatus is configured to be arranged in the opening; and a first step surface of the step structure parallel to the first surface of the arc surface structure is located in the opening.

In a possible implementation manner, the maximum distance between the second surface of the arc surface structure and the first step surface is greater than or equal to 0.9 mm.

In a possible implementation manner, a width of the first step surface is greater than 0.1 mm.

In a possible implementation manner, a width of the capacitive fingerprint identification package structure is greater than or equal to 2.4 mm.

In a possible implementation manner, the capacitive fingerprint identification apparatus further includes:
a color coating layer, covering the arc surface structure and the packaging material layer.

In a possible implementation manner, the capacitive fingerprint identification package structure further includes:
a second substrate, electrically connected to the first substrate, configured to transmit a fingerprint capacitance signal of the capacitive fingerprint sensor.

In a possible implementation manner, the capacitive fingerprint identification package structure further includes:
an underfill glue, filled between the second substrate and the first substrate, and configured to improve connection reliability between the second substrate and the first substrate.

In a possible implementation manner, an edge area of the first substrate forms a step structure, the step structure being configured to accommodate the underfill glue.

In a possible implementation manner, a material of the arc surface structure is a high temperature resistant ultraviolet (UV) light glue.

In a possible implementation manner, a dielectric constant of the arc surface structure is greater than 3.4.

In a possible implementation manner, the capacitive fingerprint identification apparatus is configured to be arranged in a side surface of the electronic device.

In a possible implementation manner, the capacitive fingerprint identification apparatus is arranged on a target key of the electronic device, the target key is arranged on a side surface of the electronic device, and the target key is configured to realize a target function and a fingerprint identification function.

In a second aspect, provided is a preparation method for a capacitive fingerprint identification apparatus, including:
preparing a packaging sheet, the packaging sheet including a plurality of capacitive fingerprint sensors;
preparing, by an arc surface fixture, a plurality of arc surface structures on the packaging sheet, the plurality of arc surface structures being provided in one-to-one correspondence with the plurality of capacitive fingerprint sensors;
cutting the packaging sheet to obtain a plurality of package structures, each package structure in a plurality of package structure sheets includes a capacitive fingerprint sensor and an arc surface structure; and
preparing the capacitive fingerprint identification apparatus based on the package structure.

In a possible implementation manner, a material of the arc surface fixture is a transparent material, and a surface of the arc surface fixture forms a plurality of first concave arc surfaces; and
the preparing, by an arc surface fixture, a plurality of arc surface structures on the packaging sheet includes:
dropping a first ultraviolet light UV glue into the plurality of first concave arc surfaces in the arc surface fixture;
attaching the packaging sheet to the arc surface fixture, so that the first UV glue in the plurality of first concave arc surfaces contacts the packaging material layer in the packaging sheet; and
irradiating a first UV light on the first UV glue, where the first UV glue in the plurality of first concave arc surfaces is cured to form the plurality of arc surface structures, and the plurality of arc surface structures are connected to the packaging material layer.

In a possible implementation manner, the arc surface fixture includes: a first support layer and a first arc surface layer;
a first surface of the first arc surface layer forming the plurality of first concave arc surfaces; and
a second surface of the first arc surface layer being a plane, connected to the first support layer.

In a possible implementation manner, the preparation method further includes: preparing the first support layer and the first arc surface structure layer.

In a possible implementation manner, the preparing the first support layer and the first arc surface structure layer, includes:
obtaining a first model fixture, where a material of the first model fixture is a non-transparent material, and a plurality of second concave arc surfaces are formed on a surface of the first model fixture; and
preparing, by the first model fixture, the first support layer and the first arc surface structure layer.

In a possible implementation manner, the preparing, by the first model fixture, the first support layer and the first arc surface structure layer, includes:
dropping a second UV glue into the plurality of second concave arc surfaces in the surface of the first model fixture;
preparing the second support layer on the surface of the first model fixture;
irradiating a second UV light on the second UV glue, where the second UV glue in the plurality of second concave arc surfaces is cured to form a plurality of second arc surface structures, and the plurality of second arc surface structures are connected to the second support layer to form a second model fixture;
separating the second model fixture and the first model fixture; and
preparing, by the second model fixture, the first support layer and the first arc surface structure layer.

In a possible implementation manner, the preparing, by the second model fixture, the first support layer and the first arc surface structure layer, includes:
flipping the second model fixture, the plurality of second arc surface structures in the second model fixture facing upward;
dropping a third UV glue into a gap of the plurality of second arc surface structures;
preparing the first support layer above the third UV glue;
irradiating a third UV light on the third UV glue, where the third UV glue is cured to form the first arc surface layer, and the first arc surface layer is connected to the first support layer to form the arc surface fixture; and
separating the second model fixture and the arc surface fixture.

In a possible implementation manner, a Rockwell hardness of a material of the first model fixture needs to be greater than a first preset value, and/or a surface roughness of the first model fixture is less than a second preset value, in order to improve serviceability of the first model fixture.

In a possible implementation manner, the first model fixture includes: a steel fixture.

In a possible implementation manner, the preparing the capacitive fingerprint identification apparatus based on the package structure, includes:
welding the first substrate in the package structure on the second substrate;
filling the underfill glue between the second substrate and the first substrate;

preparing a color coating layer on a surface of the package structure, to obtain the capacitive fingerprint identification apparatus.

In a possible implementation manner, the preparing the packaging sheet, includes:

preparing a plurality of first recesses on a surface of the first substrate layer of the packaging sheet, where each first recess of the plurality of first recesses is provided between two adjacent capacitive fingerprint sensors in the plurality of capacitive fingerprint sensors, and the plurality of first recesses are configured to accommodate the underfill glue.

In a third aspect, provided is a capacitive fingerprint identification apparatus, including:

the capacitive fingerprint identification apparatus prepared in the preparation method according to the second aspect or any one of the possible implementation manners of the second aspect.

In a fourth aspect, provided is an electronic device, including the capacitive fingerprint identification apparatus according to the first aspect or any one of the possible implementation manners of the first aspect.

In a possible implementation manner, the capacitive fingerprint identification apparatus is configured to be provided in a side surface of the electronic device.

In a possible implementation manner, the capacitive fingerprint identification apparatus is provided on a target key of the electronic device, the target key is provided on a side surface of the electronic device, and the target key is configured to realize a target function and a fingerprint identification function.

In a possible implementation manner, the target key is a power key of an electronic device.

DESCRIPTION OF EMBODIMENTS

The Technical solutions in embodiments of the present application will be described hereinafter with reference to the accompanying drawings.

It should be understood that embodiments of the present application could be applied to a capacitive fingerprint apparatus, including, but not limiting to a capacitive fingerprint identification apparatus and a product based on capacitive fingerprint imaging Embodiments of the present application is merely described by taking the capacitive fingerprint apparatus as an example but not intended to impose any limitation on embodiments of the present application.

As a common application scenario, the capacitive fingerprint apparatus provided in embodiments of the present application may be applied to a smart phone, a tablet computer and a mobile terminal of other types or other electronic devices. More specifically, in the above electronic device, the capacitive fingerprint system may be provided on any surface where the electronic system interacts with the user, including but not limited to the front, back or side surface of the electronic device.

Figure 1:
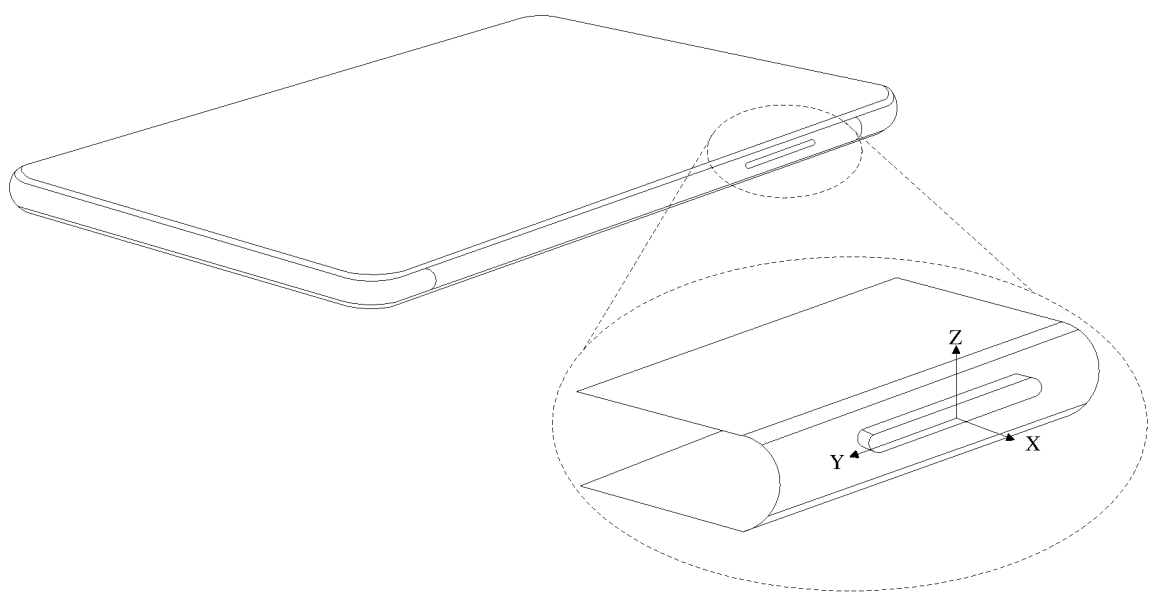
FIG. 1 is a schematic structural diagram of an electronic device applicable to the present application.

As an example, as shown in FIG. 1, the electronic device where the capacitive fingerprint apparatus provided by the embodiment of the present application is located is a mobile phone, and the capacitive fingerprint apparatus may be provided on a side surface of the mobile phone.

In some implementation manners, the capacitive fingerprint apparatus may be an independent component embedded in the side surface of the mobile phone, and is only configured to realize the fingerprint identification function.

In some other implementation manners, the capacitive fingerprint apparatus may be integrated and provided on a target key embedded in the side surface of the mobile phone. For example, the target key includes but is not limited to a power key of the electronic device. In addition to being used to start/wake up the mobile phone, the power key may also be used to realize the fingerprint identification function. Further, in this implementation manner, on the basis of successful fingerprint identification, the mobile phone may be restarted/waked up to improve the security performance of mobile phone authentication.

Figure 2:
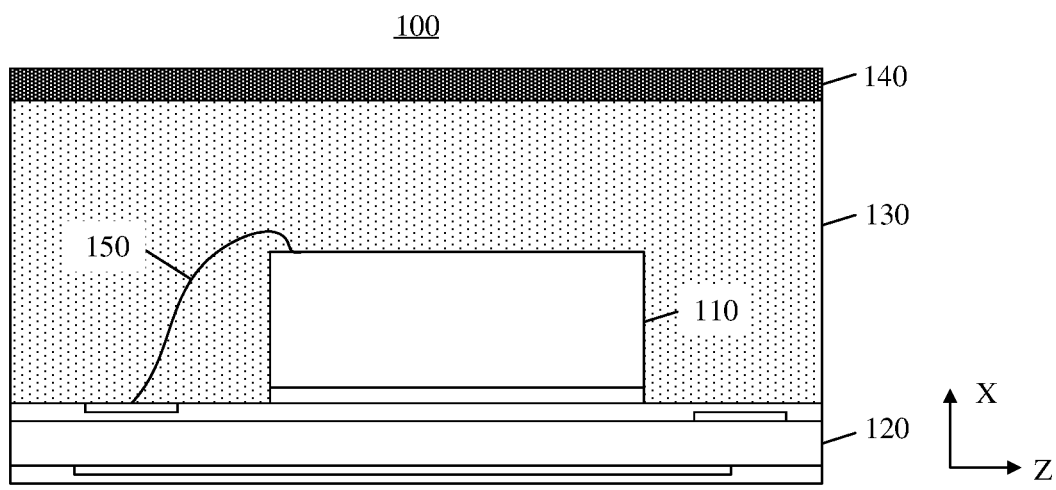
FIG. 2 is a schematic structural diagram of a capacitive fingerprint identification apparatus according to an embodiment of the present application.

FIG. 2 shows a schematic structural diagram of a capacitive fingerprint identification apparatus 100 according to an embodiment of the present application. The capacitive fingerprint identification apparatus 100 may be provided on the key shown in FIG. 1, and the schematic structural diagram is a schematic cross-sectional view of the capacitive fingerprint identification apparatus 100 on the plane where the X and Z axes are located. Among that, the positive direction of the X axis is the direction toward the outside of the side surface of the electronic device.

As shown in FIG. 2, the capacitive fingerprint identification apparatus 100 may include: a capacitive fingerprint sensor 110, a substrate 120, a packaging material layer 130, a coating layer 140 and an electrical connector 150.

Among that, the capacitive fingerprint sensor 110 is configured to determine where a fingerprint ridge is located and where a fingerprint valley is located according to values of capacitance formed according to the fingerprint ridge and the fingerprint valley with a sensing electrode. The operating process is pre-charging a capacitive sensing electrode on each pixel point to a certain reference voltage. When a finger touches a surface of a semiconductor capacitive fingerprint sensor, a capacitor array is formed between a finger fingerprint and a pixel array, and a capacitance value of each fingerprint capacitor in the capacitor array becomes small as a distance between conductors increases, because a fingerprint ridge is convex, while a fingerprint valley is concave. According to the relationship between the capacitance value and the distance, different capacitance values are generated for the fingerprint ridge and fingerprint valley, respectively. Then, discharge is performed using a discharge current, and a fingerprint image is obtained by reading a capacitance difference between charge and discharge.

To put it simply, a capacitive fingerprint sensor 110 includes a plurality of pixel circuits, each of the pixel circuits has a pixel electrode (i.e., a sensing electrode plate) to generate fingerprint capacitance with a fingerprint on a surface of a finger, and all pixel electrodes form a pixel array. Since a distance between a fingerprint ridge and the pixel electrode is different from that between a fingerprint valley and the pixel electrode, capacitance of a fingerprint capacitor formed there between is different. Whether the pixel electrode is located at a fingerprint ridge or a fingerprint valley may be identified by detecting a capacitance value, and a fingerprint image may be obtained according to a detection result of each of the pixel circuits.

Specifically, in FIG. 2, the capacitive fingerprint sensor 110 is a sensor chip, which may be provided on the substrate 120 through an glue layer, such as a die attach film DAF) glue layer, and connected to a pad of the substrate 120 through the electrical connector 150 (such as a gold wire), to transmit its detected capacitance value to a circuit of the substrate 120 through the electrical connector 150, and further to transmit a capacitance value to other electronic modules on the substrate 120, or transmit to other electronic modules electrically connected to the substrate 120. The other electronic modules include but are not limited to a processing module or a storage module, and the like.

Further, a packaging material layer 130 covers around the capacitive fingerprint sensor 110, and the packaging material layer 130 is configured to protect the capacitive fingerprint sensor 110 and its electrical connector 150, and a surface of the packaging material layer 130 is a plane.

In addition, in the capacitive fingerprint identification apparatus 100, a coating layer 140 is further provided above the packaging material layer 130, and a surface of the coating layer 140 is also a plane. Optionally, the coating layer 140 may be a coating layer with a color, and is configured to further protect the capacitive fingerprint identification apparatus 100 and improve its appearance. During the fingerprint identification process, a finger is placed on the surface of the coating layer 140 to influence a capacitance value detected by the capacitive fingerprint sensor 110. An area of the coating layer 140 corresponding to the capacitive fingerprint sensor 110 may be referred to as a fingerprint detection area of the capacitive fingerprint identification apparatus 100.

Currently, as shown in FIG. 1, in the terminal electronic device, in order to facilitate the user to hold and improve the user experience, or to improve the appearance of the electronic device, side surfaces of most terminal electronic devices are designed as arc surfaces. In this case, since the surface of the current capacitive fingerprint identification apparatus (such as the capacitive fingerprint identification apparatus 100 shown in FIG. 2) is a plane, if the plane capacitive fingerprint apparatus is embedded in an arc surface on a side line of the mobile phone, it will not only influence the appearance of the electronic device, but also influence the user's feel of usage. In addition, in harsh environments such as sand and dust, the dust is often easily adsorbed on the plane of the capacitive fingerprint apparatus, resulting in problems such as misjudgment of fingerprint identification. In addition, when the mobile phone is dropped, the entire plane of the capacitive fingerprint identification apparatus will be damaged, which will influence the performance of the capacitive fingerprint identification apparatus.

Based on the above problems, the present application provides a capacitive fingerprint identification apparatus with a new structure, which has an arc-shaped three-dimensional surface. It can not only make the electronic device where it is located more aesthetical in appearance, and have a more three-dimensional sense, bringing a brand new sense of sight to the user group. In addition, the arc surface three-dimensional design is adopted to protect the electronic device when being dropped. The contact with the capacitive fingerprint identification apparatus is a point instead of a surface, so the influence on the capacitive fingerprint identification apparatus is small, and the arc surface design also acts as a buffer when the electronic device falls. Thirdly, dust and the like are difficult to be absorbed on the arc-shaped three-dimensional surface of the capacitive fingerprint identification apparatus, and the interference to fingerprint identification is small.

Hereinafter, the capacitive fingerprint identification apparatus according to the embodiment of the present application will be described in detail in conjunction with FIG. 3 to FIG. 6.

It should be noted that in embodiments shown below, the same structures are denoted by the same reference signs for ease of understanding, and detailed description of the same structures is omitted for brevity.

Figure 3:
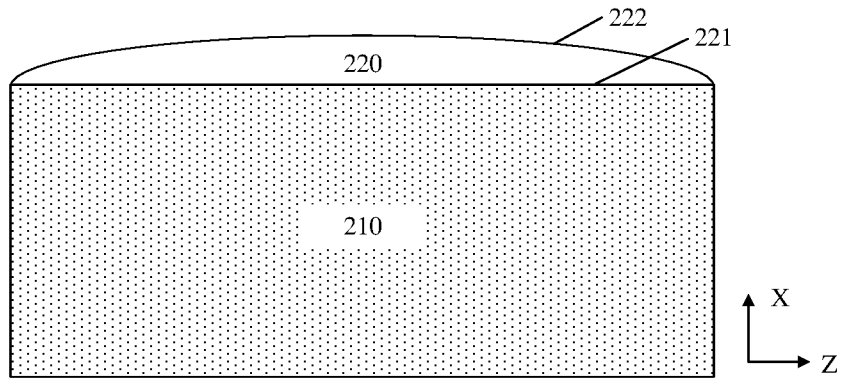
FIG. 3 is a schematic structural diagram of a capacitive fingerprint identification apparatus according to an embodiment of the present application.

FIG. 3 is a schematic structural diagram of a capacitive fingerprint identification apparatus 200 provided in an embodiment of the present application, and the capacitive fingerprint identification apparatus 200 is configured to be provided on an arc-shaped surface of the electronic device, for example, may be provided on an arc-shaped side surface of the electronic device.

Similar to the capacitive fingerprint identification apparatus 100 in FIG. 2, the capacitive fingerprint identification apparatus 200 may also be provided on the key shown in FIG. 1, and the schematic structural diagram is a schematic cross-sectional view of the capacitive fingerprint identification apparatus 200 on the plane where the X and Y axes are located. Among that, the positive direction of the X axis is the direction toward the outside of the side surface of the electronic device.

As shown in FIG. 3, the capacitive fingerprint identification apparatus 200 includes:
  a capacitive fingerprint identification package structure 210;
  an arc surface structure 220, including a first surface 221 and a second surface 222, where the first surface 221 of the arc surface structure 220 is a plane, the second surface 222 of the arc surface structure 220 is an arc surface, and the first surface 221 of the arc surface structure 220 is connected to a first surface of the capacitive fingerprint identification package structure 210, and the first surface of the capacitive fingerprint identification package structure 210 is a side facing the outside of the electronic device.

Specifically, as shown in FIG. 3, the capacitive fingerprint identification package structure 210 is generally approximated as a block structure, which includes a corresponding first surface (such as the upper surface of the capacitive fingerprint identification package structure 210 in FIG. 3) and second surface (such as the lower surface of the capacitive fingerprint identification package structure 210 in FIG. 3), where the first surface of the capacitive fingerprint identification package structure 210 is a side facing the outside of the electronic device, and a second surface of the capacitive fingerprint identification package structure 210 is a side facing the inside of the electronic device. With respect to the second surface, the first surface is located in the positive direction of its X axis.

Further, as shown in FIG. 3, with respect to the first surface of the capacitive fingerprint identification package structure 210, the second surface 222 of the arc surface structure 220 is located in the positive direction of its X axis. In other words, the second surface 222 of the arc surface structure 220 faces the outside of the electronic device, which helps to sense the user's finger to detect the user's fingerprint.

Figure 4:
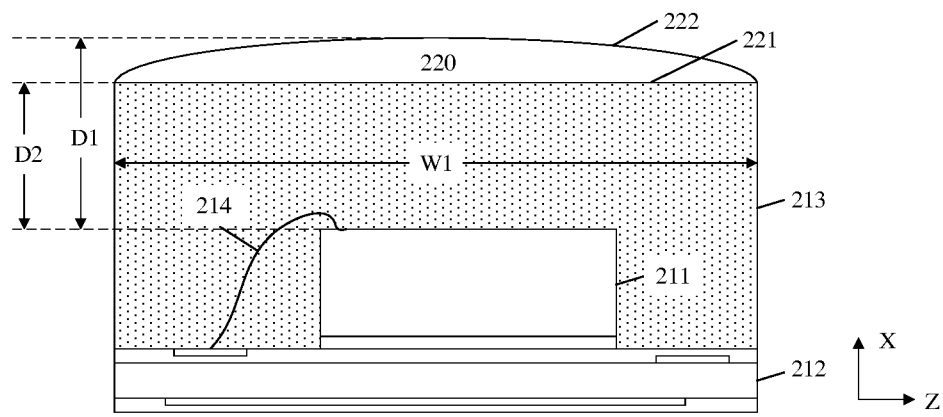
FIG. 4 to FIG. 6 are schematic structural diagrams of other types of the capacitive fingerprint identification apparatus according to an embodiment of the present application.

Optionally, FIG. 4 shows a schematic structural diagram of another capacitive fingerprint identification apparatus 200. As shown in FIG. 4, the above capacitive fingerprint identification package structure 210 may include: a capacitive fingerprint sensor 211, a first substrate 212, a packaging material layer 213 and electrical connector 214.

Among that, the capacitive fingerprint sensor 211, the first substrate 212, the packaging material layer 213 and the electrical connector 214 may refer to the relevant description of the capacitive fingerprint sensor 110, the substrate 120, the packaging material layer 130 and the electrical connector 150 in FIG. 2 above.

Similar to FIG. 2, in the embodiment of the present application, the capacitive fingerprint sensor 211 is provided above the first substrate 212 and connected to the first substrate 212 through the electrical connector 214, and the packaging material layer 213 covers the capacitive fingerprint sensor 211 and the electrical connector 214, and is connected to the first substrate 212.

Specifically, the packaging material layer 213 is generally a block material, and its first surface (the upper surface of the packaging material layer 213 as in FIG. 4) is connected to the first surface 221 of the arc surface structure 220 to form a stable connection structure.

In some implementation manners, the arc surface structure 220 may be directly grown on a first surface of the packaging material layer 213, or, in other implementation manners, the arc surface structure 220 may also be connected to the first surface of the packaging material layer 213 through a glue layer and other connection layers.

Optionally, a shape and an area of the first surface of the packaging material layer 213 are the same as those of the first surface 221 of the arc surface structure 220. In this case, the shapes and areas of the arc surface structure 220 and the capacitive fingerprint identification package structure 210 cooperate with each other, and have high practicability and appearance.

It may be seen from the above that the design of the first surface 221 of the arc surface structure 220 is relevant to the surface of the packaging material layer 213. Optionally, in the embodiment of the present application, the second surface 222 of the arc surface structure 220 may satisfy at least one of the following features.

(1) The maximum distance between the second surface 222 of the arc surface structure 220 and the above capacitive fingerprint sensor 211 (such as the distance D1 from the top of the second surface 222 to the surface of the capacitive fingerprint sensor 211 shown in FIG. 4) is less than or equal to a first preset threshold, so that a fingerprint capacitance value detected by the capacitive fingerprint sensor 211 can be configured for fingerprint detection. In other words, the fingerprint capacitance value detected by the capacitive fingerprint sensor 211 may be made to be greater than a target threshold, to ensure the fingerprint detection performance of the capacitive fingerprint sensor 211.

It may be understood that the fingerprint capacitance value is a capacitance value between a surface of the finger and a pixel electrode in the capacitive fingerprint sensor 211. In the embodiment of the present application, the finger may be provided on the second surface 222 of the arc surface structure 220. The greater the distance between the second surface 222 and the capacitive fingerprint sensor 211, the greater the distance between the finger and the pixel electrode in the capacitive fingerprint sensor 211, and the small the fingerprint capacitance value, which does not facilitate the capacitive fingerprint sensor 211 for fingerprint detection. Therefore, the maximum distance between the second surface 222 of the arc surface structure 220 and the capacitive fingerprint sensor 211 needs to be less than a certain preset threshold to ensure the fingerprint detection performance of the capacitive fingerprint sensor 211.

As an example, the above first preset threshold may be 250 μm.

(2) The maximum distance between the second surface 222 of the arc surface structure 220 and the first surface of the capacitive fingerprint sensor 211 is greater than or equal to a second preset threshold to ensure that the arc surface structure 220 and the packaging material layer 213 have a sufficient thickness to protect the capacitive fingerprint sensor 211.

This implementation manner may prevent the arc surface structure 220 above the capacitive fingerprint sensor 211 and the packaging material layer 213 in the subsequent use from being small in thickness, which is easily damaged or falling off, and cannot protect the capacitive fingerprint sensor 211 well, thereby influencing the fingerprint detection performance of the capacitive fingerprint sensor 211.

As an example, the above second preset threshold may be 160 μm.

That is, if the maximum distance between the second surface 222 of the arc surface structure 220 and the capacitive fingerprint sensor 211 (such as the distance D1 shown in FIG. 4) satisfies the above two conditions simultaneously, 160 μm≤D1≤250 μm.

(3) A curvature radius of an edge area in the second surface 222 of the arc surface structure 220 is less than a curvature radius of a middle area.

In the embodiment of the present application, the curvature radius of the edge area in the second surface 222 may be set large, and the curvature radius of the middle area in the second surface 222 may be set small. In other words, the middle area of the second surface 222 is relatively gentle and the edge area is relatively steep.

By this implementation manner, on the basis of ensuring the arc surface design, the curvature radius of the middle area in the second surface 222 is designed to be small, which can make a small distance difference between each part in the middle area and the capacitive fingerprint sensor 211, having no or little influence on the fingerprint identification of the capacitive fingerprint sensor 211.

Further, the curvature radius of the edge area in the second surface 222 is designed to be large, to prevent a sharp angle from forming between the second surface 222 and the side surface of the packaging material layer 213, and to improve the feel when the user's finger contacts the edge area of the second surface 222, thereby improving the users' using experience.

As an example, the curvature radius of the edge area in the second surface 222 includes, but is not limited to 0.2. The curvature radius of the middle area in the second surface 222 may be in a range of 5 to 5.5.

Further, a material of the arc surface structure 220 may be any insulating material, which may be prepared in various ways, such as computer numerical control (CNC) processing, profiling grinding, packaging and injection molding, secondary molding, ultraviolet (UV) glue curing and other methods for preparation.

Preferably, in the embodiment of the present application, the arc surface structure 220 may be prepared by light curing. For example, the arc surface structure 220 may be the cured UV glue. The arc surface structure 220 may be prepared by adopting this light curing method with a low cost and high productivity.

Further, the material of the arc surface structure 220 is a high temperature resistant material, which can prevent the high temperature in the assembly process from influencing it. For example, the temperature under the surface-mount technology (SMT) process will not influence the arc surface structure 220, will not cause the arc surface structure 220 to drop, and will also not causes the arc surface structure 220 to change colors.

In addition, a dielectric constant of the arc surface structure 220 is greater than a preset threshold, for example, may be greater than 3.4, thereby increasing a fingerprint capacitance value detected by the capacitive fingerprint sensor 211 and improving the performance of the capacitive fingerprint identification apparatus In the capacitive fingerprint identification apparatus 200 provided by the embodiment of the present application, in addition to the relevant design of the arc surface structure 220 described above, the relevant design solutions of other components are described as follows.

(1) The Packaging Material Layer 213

Optionally, the maximum distance between the first surface of the packaging material layer 213 and the first surface of the above capacitive fingerprint sensor 211 (such as the distance D2 shown in FIG. 4) is less than or equal to a third preset threshold, so that the fingerprint capacitance value detected by the capacitive fingerprint sensor 211 can be configured for fingerprint detection.

A design principle of the third preset threshold is similar to a design principle of the first preset threshold above, which will not be repeated here.

As an example, if the packaging material layer 213 is a high dielectric constant material (for example, the dielectric constant is greater than 7), the third predetermined threshold may be 150 μm. If it is a low dielectric constant material (for example, the dielectric constant is less than 4), the third preset threshold may be 70 μm.

Optionally, the material of the packaging material layer 213 includes but is not limited to an epoxy molding compound (EMC), which may also be other packaging materials in the relevant art. The embodiment of the present application does not limit the specific type of the packaging material layer 213.

(2) The First Substrate 212 and the Electrical Connector 214

Optionally, the first substrate 212 includes but is not limited to a printed circuit board (PCB), a flexible printed circuit (FPC), or a rigid flex board, or the like. The embodiment of the present application also does not limit the specific type of the first substrate 212.

Optionally, the electrical connector 214 includes but is not limited to a gold wire, which is electrically connected to the capacitive fingerprint sensor 211 and a substrate pad by wire bonding (WB). The electrical connector 214 may also be an electrical connector in other relevant technologies such as a through silicon via (TSV), and the embodiment of the present application also does not limit the specific type of the electrical connector 214.

Specifically, in FIG. 4, in the X direction, D1 and D2 equidistance is designed to meet the needs of fingerprint detection. Optionally, in the Z direction, a width of the capacitive fingerprint identification package structure 210 (such as the distance W1 shown in FIG. 4) is greater than or equal to a fourth preset threshold, to increase a fingerprint detection area of the capacitive fingerprint sensor 211, thereby ensuring the fingerprint detection performance of the capacitive fingerprint sensor 211.

In the embodiment shown in FIG. 4, the width W1 of the capacitive fingerprint identification package structure 210 is also a width of the packaging material layer 213 in the Z direction.

As an example, the fourth preset threshold may be 2.4 mm, that is, W1≥2.4 mm.

Figure 5:
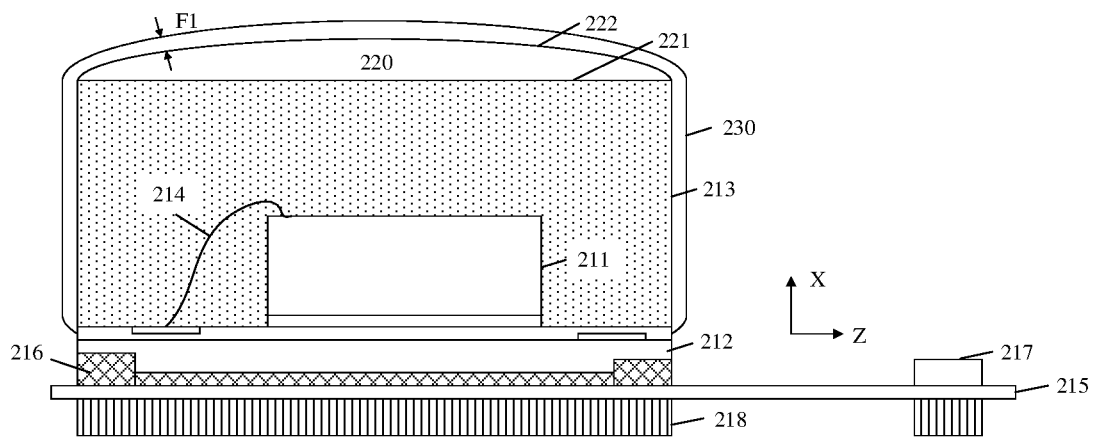

FIG. 5 is a schematic structural diagram of another capacitive fingerprint identification apparatus 200 provided in an embodiment of the present application.

As shown in FIG. 5, the capacitive fingerprint identification apparatus 200 may further include:

a color coating layer 230, covering the above arc surface structure 220 and the packaging material layer 213.

Specifically, as shown in FIG. 5, the color coating layer 230 covers the second surface 222 of the arc surface structure 220 and also covers four side surfaces of the packaging material layer 213.

Optionally, a color of the color coating layer 230 may be the same as an appearance color of the electronic device where the capacitive fingerprint identification apparatus 200 is located, or may also be any other preset color.

By providing the color coating layer 230 on the arc surface structure 220, the appearance of the capacitive fingerprint identification apparatus 200 may be improved, to improve the user experience. In addition, the color coating layer 230 can also be configured to further protect the capacitive fingerprint sensor 211 in the capacitive fingerprint identification apparatus 200.

In some implementation manners, a thickness of the color coating layer 230 (such as the thickness F1 shown in FIG. 5) is within a preset threshold range, so that it has a sufficient thickness and may also ensure the fingerprint detection performance of the capacitive fingerprint sensor 211.

As an example, the thickness of the color coating layer 230 may have a threshold range of 10 μm to 40 μm, that is, 10 μm≤F1≤40 μm.

In order to provide the color coating layer 230 on the arc surface structure 220, a surface hardness of the arc surface structure 220 needs to be greater than a certain preset threshold, and a water drop angle also needs to be less than a certain preset threshold. As an example, a surface hardness of the arc surface structure 220 is greater than 4 H, and the water drop angle is less than 60°.

Optionally, as shown in FIG. 5, in the embodiment of the present application, the capacitive fingerprint identification package structure 210 further includes: a second substrate 215, electrically connected to the above first substrate 212 for transmitting the fingerprint capacitance signal of the capacitive fingerprint sensor 211.

Optionally, the first substrate 212 forms a plurality of connection points, and the plurality of connection points are electrically connected to the second substrate 215 through a welded ball. Moreover, the second substrate 215 is also provided with a connector 217, for electrically connecting the capacitive fingerprint identification apparatus 200 and other electrical apparatuses in the electronic device where it is located.

As an example, the first substrate 212 may be a PCB circuit board, and the second substrate 215 may be an FPC circuit board.

It may be understood that if the second substrate 215 is the FPC circuit board, a strengthening layer 218 is also provided in a part of the area connected to the second substrate 215 to support and strengthen the second substrate 215. The strengthening layer 218 includes but is not limited to a strengthening steel plate, which may also be a strengthening material layer of any other types.

Similarly, the second substrate 215 and the strengthening layer 218 may form a rigid-flex board, where the strengthening layer 218 is a core material layer.

As shown in FIG. 5, the strengthening layer 218 is provided in a corresponding area of the area where the first substrate 212 is located. In addition to supporting the second substrate 215, the strengthening layer 218 also supports the first substrate 212, the capacitive fingerprint sensor 211 connected to the first substrate 212, the packaging material layer 213 and other relevant components. In addition, the strengthening layer 218 is provided in a corresponding area of the area where the connector 217 is located, and is configured to support the connector 217.

Further, the capacitive fingerprint identification package structure 210 may further include: an underfill glue 216, which is filled between the above first substrate 212 and second substrate 215, and is configured to improve reliability of welding between the first substrate 212 and the second substrate 215.

Optionally, as shown in FIG. 5, in the first surface of the first substrate 212 opposite to the second substrate 215, a step structure is formed in its edge area, and the step structure is configured to accommodate the above underfill glue 216. Setting the step structure may facilitate the processing realization of the underfill glue.

Figure 6:
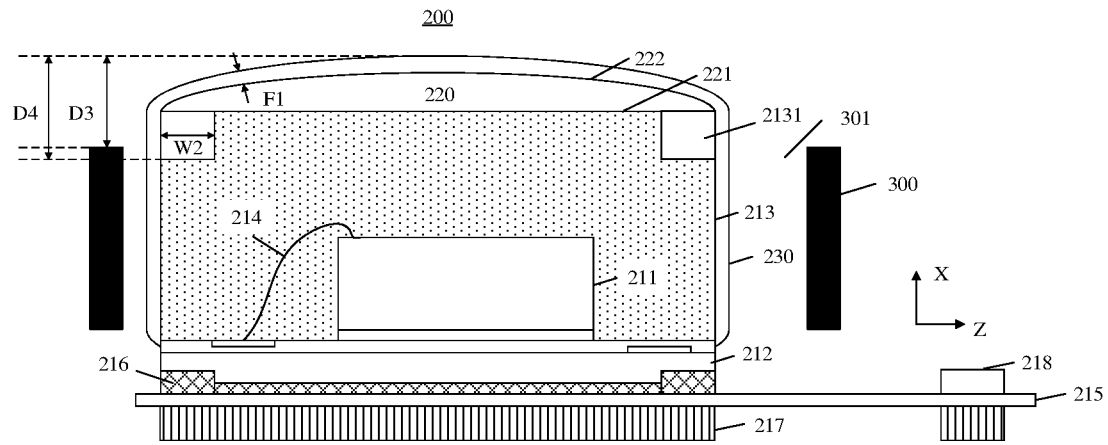

FIG. 6 is a schematic structural diagram of another capacitive fingerprint identification apparatus 200 provided in an embodiment of the present application.

Compared with FIG. 5, in the capacitive fingerprint identification apparatus 200 shown in FIG. 6, the packaging material layer 213 is further improved.

As shown in FIG. 6, in the embodiment of the present application, an edge area of the first surface of the packaging material layer 213 is provided with a step structure 2131, and a middle area of the first surface of the packaging material layer 213 is connected to a middle area of the first surface 221 of the arc surface structure 220.

Optionally, the step structure 2131 may accommodate the same material as that of the arc surface structure 220, or may accommodate air or other transparent substances.

Optionally, as shown in FIG. 6, an outer frame 300 of the electronic device is provided with an opening 301, and the capacitive fingerprint identification apparatus 200 is used to be provided in the opening 301. In some implementation manners, the surface of the outer frame 300 is an arc-shaped surface.

Referring to FIG. 6, in the step structure, the first step surface parallel to the first surface 221 of the arc surface structure 220 is located in the opening 301.

By this implementation manner, an interface of the packaging material layer 213 may be hidden in the outer frame 300, so that the user cannot easily observe the packaging material layer 213 in appearance, thereby improving the users' using experience.

As an example, the maximum distance between the second surface 222 of the arc surface structure 220 and the surface of the outer frame 300 (such as the distance D3 shown in FIG. 6) needs to be greater than or equal to a fifth preset threshold to satisfy an active journey when the capacitive fingerprint identification 200 is a key.

As an example, the fifth preset threshold is equal to 0.8 mm, that is, $D3 \geq 0.8$ mm.

Further, on this basis, in order to hide the first step surface of the step structure in the opening 301, the maximum distance between the second surface 222 of the arc surface structure 220 and the first step surface (such as the distance D4 shown in FIG. 6) is greater than or equal to a sixth preset threshold, and the sixth preset threshold is greater than the above fifth preset threshold.

As an example, the sixth preset threshold is equal to 0.9 mm, that is, $D4 \geq 0.9$ mm.

Optionally, a width of the first step surface in the Z direction (such as the width W2 shown in FIG. 6) is greater than or equal to a seventh preset threshold, so that the interface of the packaging material layer 213 may be better hidden in the outer frame 300, which improves the users' using experience.

As an example, the seventh preset threshold is equal to 0.1 mm, that is, $W2 \geq 0.1$ mm.

The embodiments of the capacitive fingerprint identification apparatus of the present application are described above in detail in conjunction with FIGS. 3 to 6, and embodiments of a preparation method for the capacitive fingerprint identification apparatus of the present application are described below in detail in conjunction with FIGS. 7 to 15; and it should be understood that the apparatus embodiments and the method embodiments correspond to each other, and similar description may be referred to the description of the apparatus embodiments.

Figure 7:
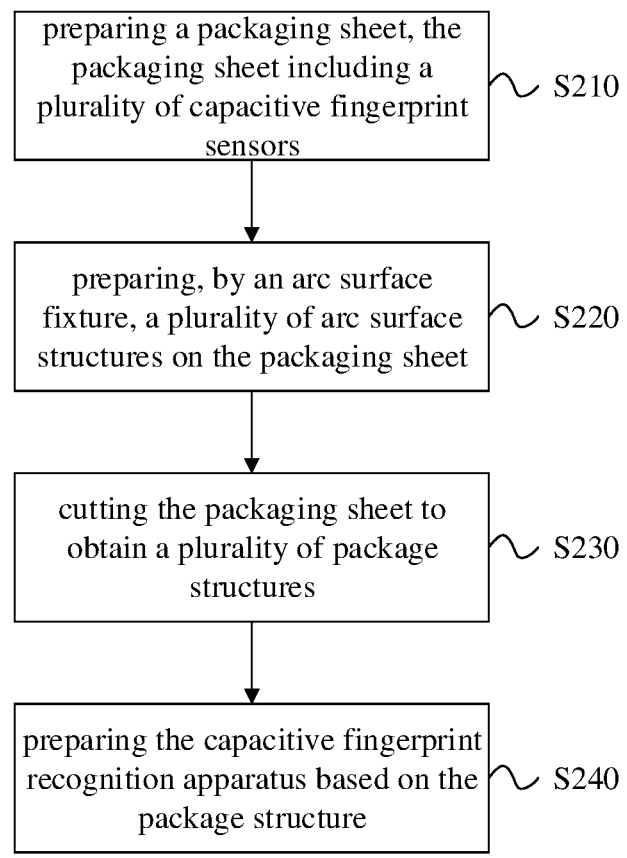
FIG. 7 is a flowchart of a preparation method for a capacitive fingerprint identification apparatus according to an embodiment of the present application.

FIG. 7 shows a flowchart of a preparation method 20 for a capacitive fingerprint identification apparatus.

As shown in FIG. 7, the preparation method 20 for the capacitive fingerprint identification apparatus may include the following steps.

S210: preparing a packaging sheet, the packaging sheet including a plurality of capacitive fingerprint sensors.

S220: preparing, by an arc surface fixture, a plurality of arc surface structures on the packaging sheet.

Specifically, the plurality of arc surface structures are provided in one-to-one correspondence with the plurality of capacitive fingerprint sensors.

S230: cutting the packaging sheet to obtain a plurality of package structures.

Specifically, each package structure in the plurality of package structure sheets includes a capacitive fingerprint sensor and an arc surface structure.

S240: preparing the capacitive fingerprint identification apparatus based on the package structure.

For easy of understanding, in accordance with the above steps, each step will be described in sequence below with reference to the accompanying drawings.

Figure 8:
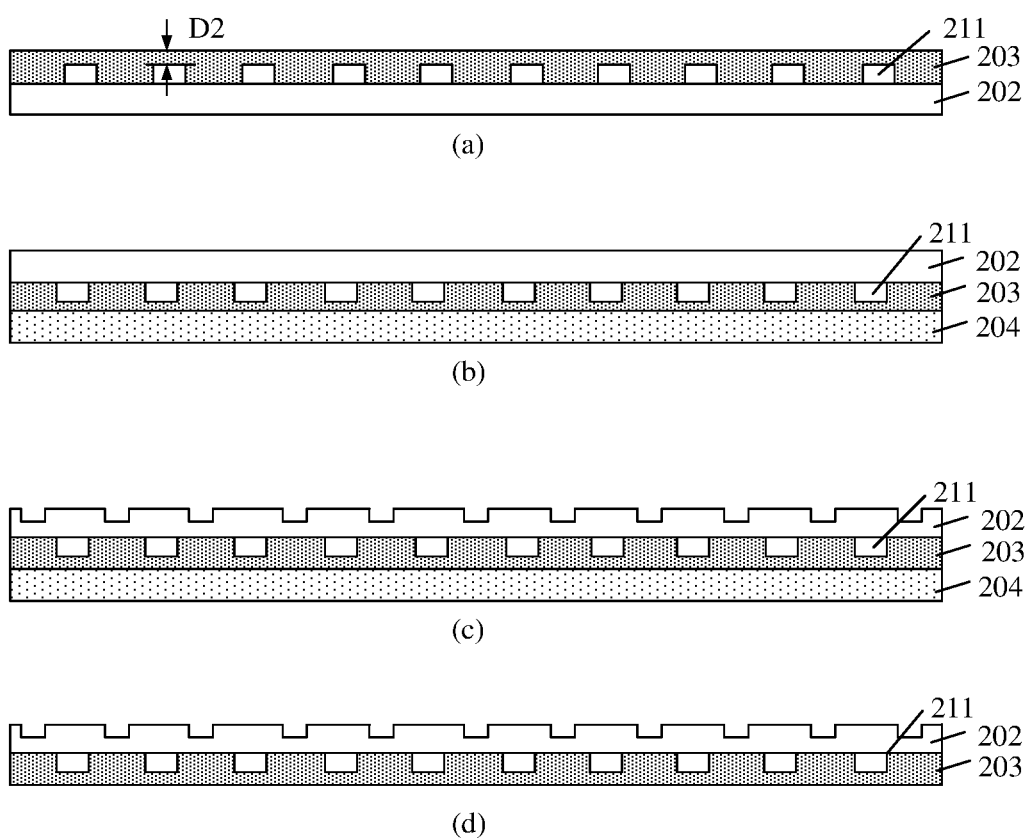
FIG. 8 is a schematic diagram of an assembly process according to an embodiment of the present application.

Specifically, (a) of FIG. 8 shows a structure of the packaging sheet prepared in step S210.

As shown in (a) of FIG. 8, the packaging sheet includes a first substrate 202; a plurality of capacitive fingerprint sensors 211 are provided on the first substrate 202; and the packaging material layer 203 covers the plurality of capacitive fingerprint sensors 211.

It may be understood that after the packaging sheet is cut, the first substrate 202 may be separated into a plurality of first substrates 212 in the above apparatus embodiment, and the packaging material layer 203 may be separated into a plurality of packaging material layer 213 in the above apparatus embodiment. Therefore, in the embodiment of the present method, for the relevant technical solution of the first substrate 202 and the packaging material layer 203, references may be made to the relevant description of the first substrate 212 and the packaging material layer 213 above, or references may also be made to relevant description in relevant packaging technologies, which will not be repeated here.

In the present step, it is required to control the maximum distance between the upper surface of the packaging material layer 203 and the upper surface of the capacitive fingerprint sensor 211 (such as the distance D2 shown in the figure), and the relevant technical solution of the distance D2 may be referred to the relevant description in FIG. 4 above.

Optionally, in some implementation manners, a plurality of arc surface structures may be directly prepared on the packaging sheet shown in (a) of FIG. 8, that is, the above step S220 is directly performed.

Optionally, in some other implementation manners, the above step S220 may also be performed after further processing the packaging sheet shown in FIG. 8(a).

Under the implementation manner, the step S210 may include the following steps.

S211: preparing a plurality of first recesses on the surface of the first substrate of the packaging sheet.

Specifically, each first recess of the plurality of first recesses is provided between two adjacent capacitive fingerprint sensors in the plurality of capacitive fingerprint sensors, and the plurality of first recesses are configured to accommodate the underfill glue in the subsequent welding process.

Optionally, in the embodiment of the present application, a CNC machining method may be adopted to prepare a plurality of first recesses on the surface of the first substrate of the packaging sheet.

Specifically, referring to (b) in FIG. 8, before CNC machining, the above packaging sheet is flipped upside down, and a protective film 204 is attached to the surface of the packaging material layer 203 of the packaging sheet to prevent contamination on the packaging material layer 203 during the CNC machining. Optionally, the protective film 204 includes, but is not limited to, a polyethylene terephthalate (PET) film.

Then, a plurality of first recesses are prepared on the surface of the first substrate 202 of the packaging sheet by adopting the CNC machining method, and the formed packaging sheet is shown in (c) of FIG. 8.

In the present step, a depth of the first recess needs to be controlled to meet the needs of the subsequent glue dispensing process.

In some implementation manners, the depth of the first recess is greater than 0.2 mm.

Finally, the protective film 204 on the surface of the packaging material layer 203 is removed to obtain the packaging sheet as shown in (d) in FIG. 8, and after cleaning the packaging sheet, step S220 is performed.

Figure 9:
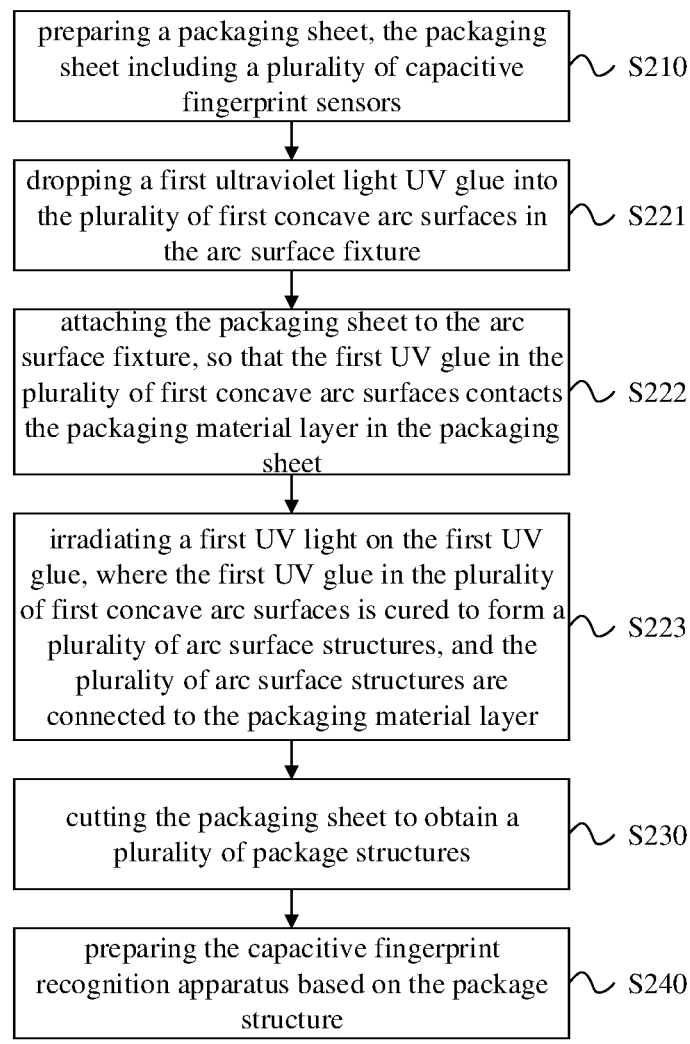
FIG. 9 is a flowchart of another preparation method for a capacitive fingerprint identification apparatus according to an embodiment of the present application.

FIG. 9 shows a flowchart of a preparation method 20 for a capacitive fingerprint identification apparatus according to an embodiment of the present application.

As shown in FIG. 9, the above step S220 may include the following steps.

S221: dropping a first ultraviolet light UV glue into the plurality of first concave arc surfaces in the arc surface fixture.

S222: attaching the packaging sheet to the arc surface fixture, so that the first UV glue in the plurality of first concave arc surfaces contacts the packaging material layer in the packaging sheet.

S223: irradiating a first UV light on the first UV glue, where the first UV glue in the plurality of first concave arc surfaces is cured to form a plurality of arc surface structures, and the plurality of arc surface structures are connected to the packaging material layer.

Specifically, compared with other processes for preparing the arc surface structure, such as CNC machining, profiling grinding, encapsulation molding, secondary molding, etc. In the embodiment of the present application, the UV glue is cured by the UV light to prepare a plurality of arc surface structures, and when the arc surface structures are prepared by adopting this method, units per hour (UPH) are high and the cost is low.

Specifically, in the embodiment of the present application, the arc surface structure obtained after curing the UV glue needs a high temperature resistant material, which can prevent the high temperature in the subsequent assembly process from influencing it, will not cause the arc surface structure to drop, and will also not causes the arc surface structure to change colors. In addition, for the plurality of arc surface structures in the embodiment of the present application, references may be made to the relevant description of the arc surface structure 220 in the above apparatus embodiments, which will not be repeated here.

Specifically, in step S220, a material of the arc surface fixture is a transparent material, which may be used to transmit the UV light; and a surface of the arc surface fixture forms a plurality of first concave arc surfaces. It may be understood that the first concave arc surface is an arc surface structure that corresponds to each other, and the structure of the first concave arc surface may also be referred to the relevant description of the arc surface structure 220 in the apparatus embodiment above.

Figure 10:
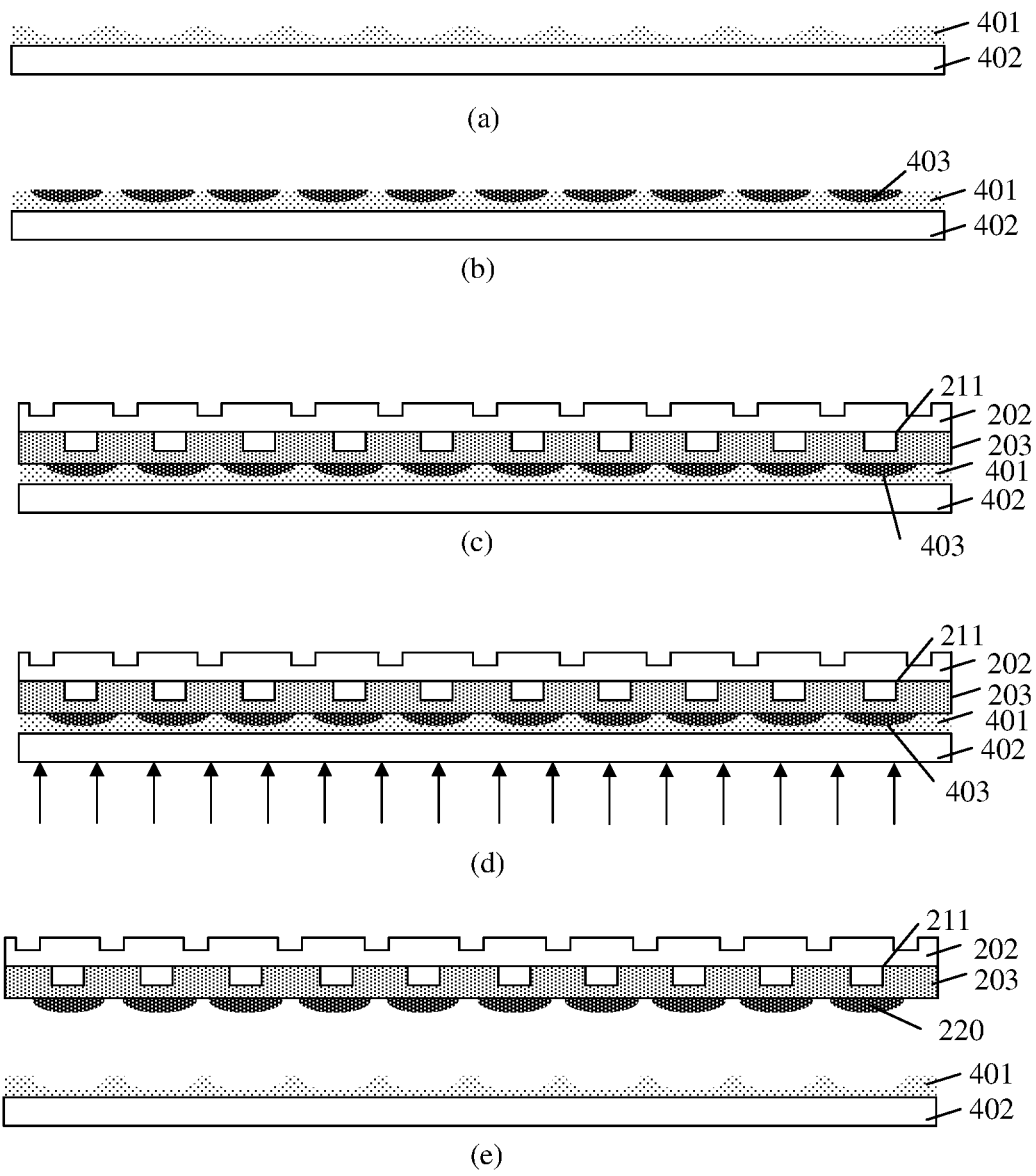
FIG. 10 and FIG. 11 are schematic diagrams of an assembly process according to an embodiment of the present application.

Optionally, (a) of FIG. 10 shows a schematic structural diagram of an arc surface fixture.

The arc surface fixture includes a first support layer 402 and a first arc surface layer 401, where a first surface of the first arc surface layer 401 forms a plurality of first concave arc surfaces, and a second surface of the first arc surface layer 401 is a plane and connected to the first support layer 402.

As an example, a material of the first support layer 402 includes, but is not limited to, a PET film, which may be any layered structure that is light-transmitting and has a supporting function. A material of the first arc surface layer 401 includes, but is not limited to, a cured UV glue, and may also be other light-transmitting materials.

It may be understood that, in the embodiment of the present application, in addition to the structure shown in FIG. 10(a), the arc surface fixture may also be any other light-transmitting structures having a plurality of first concave arc surfaces, For example, a plurality of first concave arc surfaces are formed on a light-transmitting substrate such as glass or quartz, and the embodiment of the present application does not specifically limit the specific structure and material of the arc surface fixture.

Further, (b) to (d) in FIG. 10 respectively show schematic diagrams of an assembly process for performing steps S221 to S223.

As shown in (b) of FIG. 10, a first ultraviolet light UV glue 403 is dropped into the plurality of first concave arc surfaces in the arc surface fixture;

As shown in (c) in FIG. 10, the packaging sheet shown in (d) in FIG. 8 is attached to the arc surface fixture, where the packaging sheet is above the arc surface fixture, so that the first UV glue 403 in the plurality of first concave arc surfaces contacts the packaging material layer 203 in the packaging sheet.

As shown in (d) of FIG. 10, the first UV light irradiates the first UV glue 403, the first UV glue 403 is cured to form the plurality of arc surface structures, and the plurality of arc surface structures are connected to the packaging material layer 203.

It should be noted that, in the embodiment of the present application, during the curing process of the first UV glue, the first UV glue may chemically react with the packaging material layer 203. Therefore, a plurality of arc surface structures formed after the first UV glue is cured may be stably connected to the packaging material layer 203.

As shown in (e) of FIG. 10, the arc surface fixture is separated from a plurality of arc surface structures 220. At this time, a plurality of arc surface structures 220 are prepared on the packaging sheet. The plurality of arc surface structures 220 are provided in one-to-one correspondence with the plurality of capacitive fingerprint sensors 211.

It should be noted that, in the embodiment of the present application, during the curing process of the first UV glue, the first UV glue cannot chemically react with the material of the first arc surface layer 401. Therefore, the arc surface structure 220 may be separated from the arc surface fixture.

Therefore, to sum up, in the process of the first UV light irradiation, the first UV glue needs to be able to chemically react with the material of the packaging material layer 203 and not to chemically react with the material of the first arc surface layer 401 simultaneously, in order to realize the present step S220, to prepare a plurality of arc surface structures on the packaging sheet.

Further, in step S230, the above packaging sheet prepared with a plurality of arc surface structures may be cut by adopting the CNC machining method to obtain a plurality of package structures.

Figure 11:
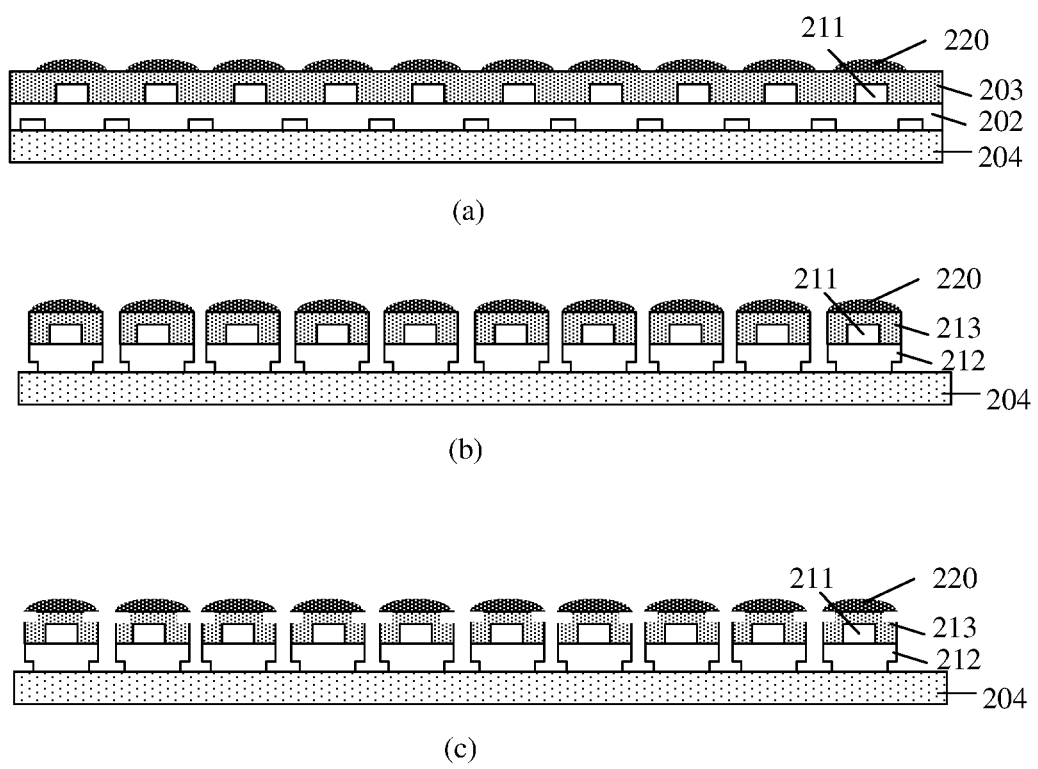

Similarly, referring to (a) of FIG. 11, before cutting by adopting the CNC machining method, the protective film 204 needs to be attached to the surface of the first substrate 202, and then the packaging sheet is cut.

(b) of FIG. 11 shows a schematic diagram of the package structure after cutting. Each package structure includes a capacitive fingerprint sensor 211, an arc surface structure 220, a packaging material layer 213 and a first substrate 212.

(c) of FIG. 11 shows a schematic diagram of another package structure after cutting. In this figure, an edge area of the upper surface of the packaging material layer 213 forms a step structure, and preparation of the step structure may improve the appearance of the capacitive fingerprint identification apparatus.

It may be understood that each package structure may further include an electrical connector that electrically connects the first substrate 212 and the capacitive fingerprint sensor 211 and other relevant structures. For the specific solution, please refer to the relevant description in the above apparatus embodiments, which is not be repeated here.

Furthermore, after the package structure is obtained by cutting, step S240 is performed, and based on the package structure, the capacitive fingerprint identification apparatus is prepared.

Figure 12:
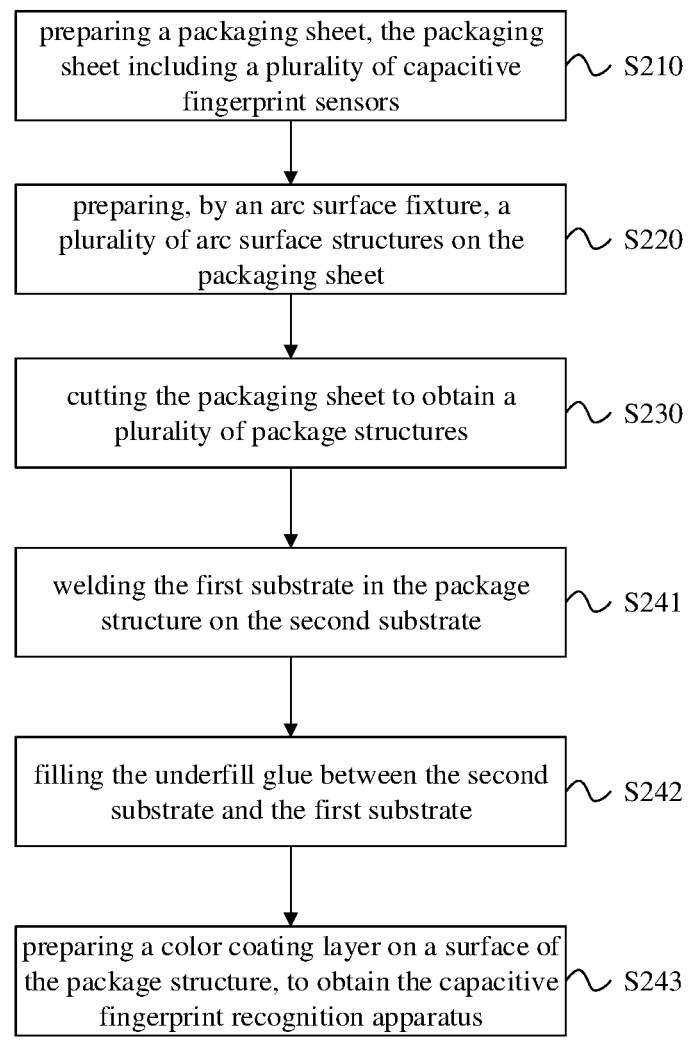
FIG. 12 is a flowchart of another preparation method for a capacitive fingerprint identification apparatus according to an embodiment of the present application.

FIG. 12 shows a flowchart of another preparation method 20 for a capacitive fingerprint identification apparatus according to an embodiment of the present application.

As shown in FIG. 12, the above step S240 may include the following steps.

S241: welding the first substrate in the package structure on the second substrate.

S242: filling the underfill glue between the second substrate and the first substrate.

S243: preparing a color coating layer on a surface of the package structure, to obtain the capacitive fingerprint identification apparatus.

Figure 13:
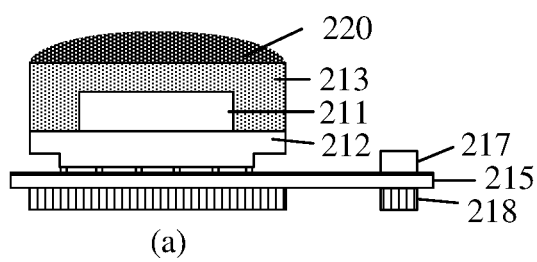
FIG. 13 is a schematic diagram of an assembly process according to an embodiment of the present application.
Figure 13:
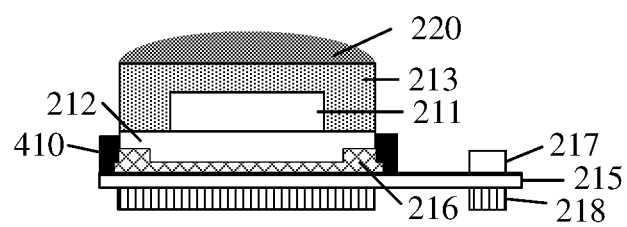
Figure 13:
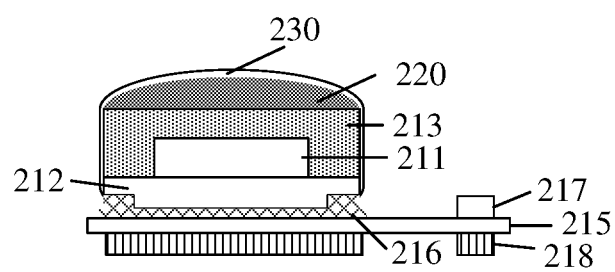

(a) to (c) in FIG. 13 respectively show schematic diagrams of an assembly process of performing steps S241 to S243 on the package structure shown in (b) of FIG. 11.

As shown in (a) of FIG. 13, the first substrate 212 may be in the package structure welded on the second substrate 215 by the SMT process.

As shown in (b) of FIG. 13, the underfill glue 216 is filled between the second substrate 215 and the first substrate 212. During this process, a masking fixture 410 is needed to limit the flow of the underfill 216, so that it is only filled between the second substrate 215 and the first substrate 212 and in the step structure at the edge of the first substrate 212.

As shown in (c) of FIG. 13, the color coating layer 230 is prepared on the surface of the package structure to obtain the capacitive fingerprint identification apparatus. For the structure of the capacitive fingerprint identification apparatus, please refer to the relevant technical solution in FIG. 5 above.

Similarly, the package structure shown in (c) of FIG. 11 is processed by the above step S240 to obtain the capacitive fingerprint identification apparatus shown in FIG. 6, and the specific process will not be repeated here.

In the above, in conjunction with FIG. 7 to FIG. 13, the specific preparation process of preparing the capacitive fingerprint identification apparatus by the arc surface fixture in the embodiment of the present application has been described.

In some implementation manners, the arc surface fixture shown in (a) of FIG. 9 may be prepared and obtained by a model fixture, so as to avoid using a large number of expensive model fixtures to prepare the arc surface structure, which may use a low-cost arc surface fixture to prepare the arc surface structure, thereby reducing the preparation cost in the entire preparation process of the capacitive fingerprint identification apparatus.

In conjunction with FIG. 14 and FIG. 15, the preparation method for the arc surface fixture in the embodiment of the present application will be described below.

Figure 14:
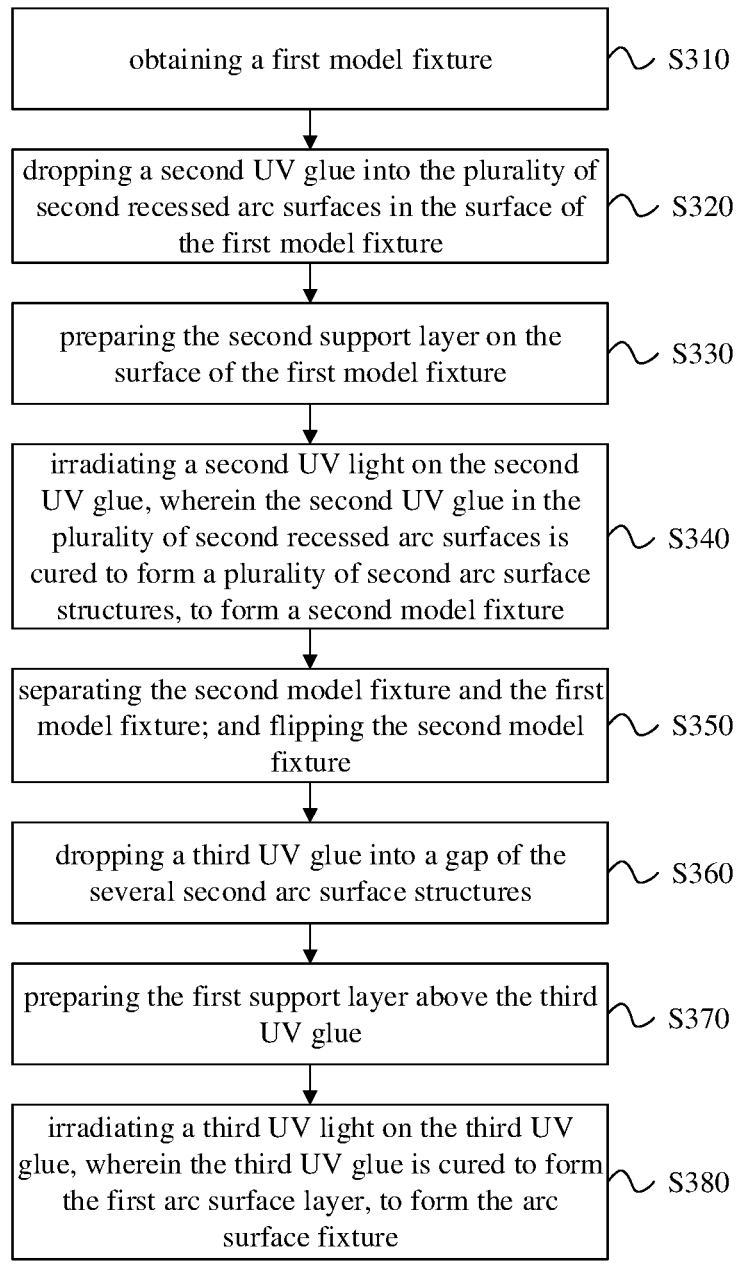
FIG. 14 is a flowchart of a preparation method of an arc surface fixture according to an embodiment of the present application.

FIG. 14 shows a flowchart of a preparation method 30 for an arc surface fixture according to an embodiment of the present application.

As shown in FIG. 14, the preparation method 30 for the arc surface fixture may include the following steps.

S310: obtaining a first model fixture.

S320: dropping a second UV glue into the plurality of second concave arc surfaces in the surface of the first model fixture.

S330: preparing the second support layer on the surface of the first model fixture.

S340: irradiating a second UV light on the second UV glue, where the second UV glue in the plurality of second concave arc surfaces is cured to form a plurality of second arc surface structures, to form a second model fixture.

S350: separating the second model fixture and the first model fixture; and flipping the second model fixture.

S360: dropping a third UV glue into a gap of the plurality of second arc surface structures.

S370: preparing the first support layer above the third UV glue.

S380: irradiating a third UV light on the third UV glue, where the third UV glue is cured to form the first arc surface layer, to form the arc surface fixture.

Figure 15:
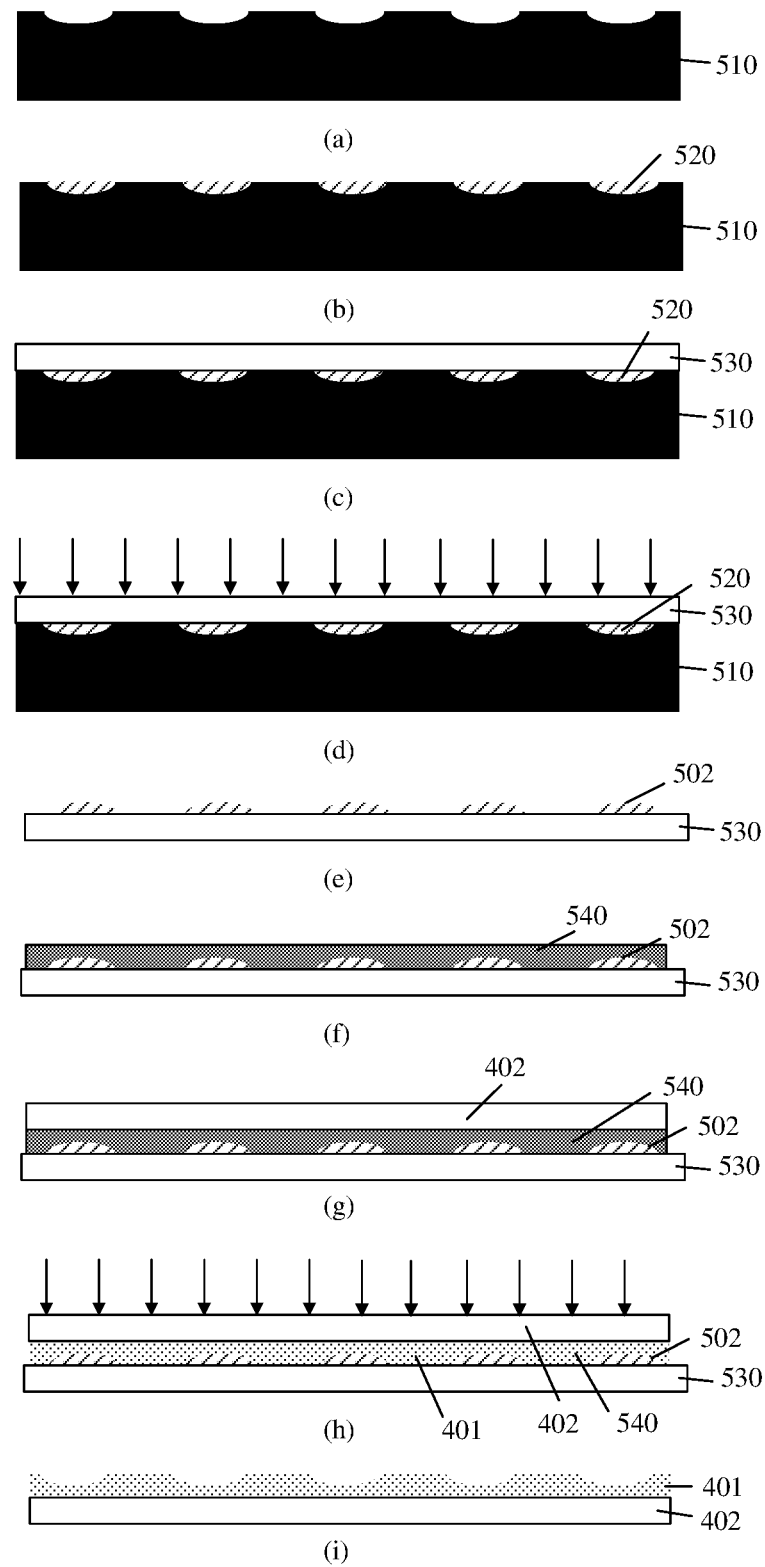
FIG. 15 is a schematic diagram of an assembly process according to an embodiment of the present application.

FIG. 15 shows a schematic diagram of an assembly process of each of the above steps S310 to S380.

(a) of FIG. 15 shows a schematic structural diagram of a first model fixture 510.

Specifically, the first model fixture is an arc surface fixture having a non-transparent material, and its reliability and durability are greater than those of an arc surface fixture directly prepared from a transparent material.

Optionally, a Rockwell hardness of a material of the first model fixture needs to be greater than a certain preset value, and/or a surface roughness needs to be less than a certain preset value, in order to improve serviceability of the first model fixture, that is, may be used repeatedly.

As an example, the Rockwell hardness of the first model fixture is greater than 50, and the surface roughness is less than 0.08. Optionally, the first model fixture may be a steel fixture, which is more durable than a model fixture of aluminum alloy, bakelite or plastic.

Further, for the specific relevant design of the plurality of second concave arc surfaces in the first model fixture, references may be made to the relevant description of the first concave arc surface and the arc surface structure above, which will not be repeated here.

As shown in (b) of FIG. 15, a second UV glue 520 is dropped into the plurality of second concave arc surfaces in a surface of the first model fixture 510.

As shown in (c) of FIG. 15, a second support layer 530 is prepared on the surface of the first model fixture 510, and the second support layer 530 contacts the second UV glue 520 in the plurality of second concave arc surfaces.

As an example, a material of the second support layer 530 includes, but is not limited to, a PET film, which may be any layered structure that is light-transmitting and has a supporting function.

As shown in (d) of FIG. 15, the second UV light irradiates the second UV glue 520, the second UV glue 520 is cured to form a plurality of second arc surface structures, and the plurality of second arc surface structures are connected to the second support layers 530, thereby forming a second model fixture.

It should be noted that, in the embodiment of the present application, during the curing process of the second UV glue, the second UV glue may chemically react with the second support layer 530. Therefore, a plurality of second arc surface structures formed after the second UV glue is cured may be stably connected to the second support layer 530 to form a second model fixture.

As shown in (e) of FIG. 15, the second model fixture is separated from the first model fixture, and the second model fixture is flipped. The upper surface of the second model fixture forms a plurality of convex second arc surface structures 502.

It should be noted that, in the embodiment of the present application, during the curing process of the second UV glue, the second UV glue cannot chemically react with the material of the first model fixture. Therefore, the arc surface structure 502 may be separated from the first model fixture.

As shown in (f) of FIG. 15, a third UV glue 540 is dropped into a gap between the plurality of second arc surface structures 502.

As shown in (g) of FIG. 15, the first support layer 402 is prepared above the third UV glue 540.

As shown in (h) of FIG. 15, the third UV light irradiates the third UV glue 540, and the third UV glue 540 is cured to form the first arc surface layer 401.

As shown in (i) of FIG. 15, the first arc surface layer 401 is separated from the second model fixture to obtain the above transparent arc surface fixture including the first arc surface layer 401 and the first support layer 402.

The present application further provides a capacitive fingerprint identification apparatus prepared according to the above preparation method.

The present application further provides an electronic device including the above capacitive fingerprint identification apparatus, or an electronic device including the capacitive fingerprint identification apparatus prepared according to any one of the method in the above preparation methods.

It should be appreciated that, in a case of no conflict, the various embodiments and/or the technical features in the various embodiments described in the present application may be combined with each other arbitrarily, and the technical solutions obtained after the combination should also fall within the protection scope of the present application.

It should be understood that the specific examples in the embodiments of this application are merely used to help a person skilled in the art to better understand the embodiments of this application, but are not used to limit the scope of the embodiments of this application.

It should be further understood that, in various embodiments of the present application, the sequence number of each process does not mean the order of execution, and the order of execution of each process should be determined by its function and internal logic, and should not set any limitation to the implementation process of the embodiments of the present application.

It should be understood that terms used in embodiments of the present application and the claims appended hereto are merely for the purpose of describing particular embodiments, and are not intended to limit the embodiments of the present application. For another example, "a", "the", and "the foregoing" in singular forms used in the embodiments of this application and the appended claims are intended to include a plural form, unless other meanings are clearly indicated in a context.

Those of ordinary skill in the art may be aware that, units of the examples described in the embodiments disclosed in this paper may be implemented by electronic hardware, computer software, or a combination of the two. To clearly illustrate interchangeability between the hardware and the software, the foregoing illustration has generally described composition and steps of the examples according to functions. Whether these functions are executed by hardware or software depends on the specific application and constraints of design of the technical solution. A person skilled in the art may use different methods to implement the described functions for each particular application, but it should not be considered that the implementation goes beyond the scope of this application.

In the plurality of embodiments provided in the present application, it should be understood that, the disclosed system and apparatus may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual coupling or direct coupling or communication connection may be indirect coupling or communication connection through some interfaces, apparatuses or units, and may also be electrical, mechanical, or connection in other forms.

The units described as separate parts may or may not be physically separate, and parts displayed as units may or may not be physical units, may be located in one position, or may be distributed on multiple network units. Some or all of the units may be selected based on actual needs to achieve the objectives of the solutions of the embodiments.

In addition, functional units in the embodiments of the present disclosure may be integrated into one processing unit, or each of the units may exist alone physically, or two or more units are integrated into one unit. The foregoing integrated unit may be implemented in the form of hardware or in the form of a software functional unit.

If the integrated unit is implemented in the form of the software functional unit and is sold or used as an independent product, it may be stored in a computer readable storage medium. The computer software product is stored in a storage medium, and includes several instructions for instructing a computer device (which may be a personal computer, a server, a network device, or the like) to perform all or some of the steps of the methods described in the embodiments of this application. The foregoing storage medium includes any medium that may store program code, such as a USB flash drive, a removable hard disk, a read-only memory (ROM), a random access memory (RAM), a magnetic disk, or an optical disc.

The foregoing descriptions are merely specific implementation manners of the present application. The protection scope of the present application, however, is not limited thereto. Any person skilled in the art who is familiar with the art could readily think of various equivalent modifications or replacements within the technical scope disclosed in the present application, and such modifications or replacements shall fall within the protection scope of the present application. Therefore, the protection scope of the present application shall be subject to the protection scope of the claims.

What is claimed is:

1. A capacitive fingerprint identification apparatus, configured to be provided on an arc-shaped surface of an electronic device, comprising:
    a capacitive fingerprint identification package structure;
    an arc surface structure, comprising a first surface and a second surface, wherein the first surface of the arc surface structure is a plane, the second surface of the arc surface structure is an arc surface, and the first surface of the arc surface structure is connected to a first surface of the capacitive fingerprint identification package structure, and the first surface of the capacitive fingerprint identification package structure is a surface facing the outside of the electronic device, wherein a material of the arc surface structure is a high temperature resistant ultraviolet (UV) light glue, and a dielectric constant of the arc surface structure is greater than 3.4.

2. The capacitive fingerprint identification apparatus according to claim 1, wherein the capacitive fingerprint identification package structure comprises: a capacitive fingerprint sensor, a first substrate, an electrical connector and a packaging material layer;
    the capacitive fingerprint sensor is connected to the first substrate through the electrical connector; and
    the packaging material layer covers the capacitive fingerprint sensor and the electrical connector, and is connected to the first substrate.

3. The capacitive fingerprint identification apparatus according to claim 2, wherein the maximum distance between the second surface of the arc surface structure and the capacitive fingerprint sensor is less than or equal to a first preset threshold, so that a fingerprint capacitance value detected by the capacitive fingerprint sensor is capable of using for fingerprint detection.

4. The capacitive fingerprint identification apparatus according to claim 3, wherein the first preset threshold is 250 μm, wherein the maximum distance between the second surface of the arc surface structure and the capacitive fingerprint sensor is greater than or equal to 160 μm.

5. The capacitive fingerprint identification apparatus according to claim 2, wherein a curvature radius of an edge area of the second surface of the arc surface structure is less than a curvature radius of a middle area of the second surface of the arc surface structure.

6. The capacitive fingerprint identification apparatus according to claim 5, wherein the curvature radius of the center area of the second surface of the arc surface structure is in a range of 5 to 5.5, and the curvature radius of the edge area of the second surface of the arc surface structure is 0.2.

7. The capacitive fingerprint identification apparatus according to claim 6, wherein an opening is provided in the arc-shaped surface of the electronic device, and the capacitive fingerprint identification apparatus is configured to be arranged in the opening; and
    a first step surface of a step structure parallel to the first surface of the arc surface structure is located in the opening.

8. The capacitive fingerprint identification apparatus according to claim 7, wherein the maximum distance between the second surface of the arc surface structure and the first step surface is greater than or equal to 0.9 mm, a width of the first step surface is greater than 0.1 mm, and a width of the capacitive fingerprint identification package structure is greater than or equal to 2.4 mm.

9. The capacitive fingerprint identification apparatus according to claim 2, wherein the capacitive fingerprint identification apparatus further comprises:
    a color coating layer, covering the arc surface structure and the packaging material layer,
    a second substrate, electrically connected to the first substrate, configured to transmit a fingerprint capacitance signal of the capacitive fingerprint sensor,
    an underfill glue, filled between the second substrate and the first substrate, and configured to improve connection reliability between the second substrate and the first substrate, or an edge area of the first substrate forms a step structure, the step structure being configured to accommodate the underfill glue.

10. The capacitive fingerprint identification apparatus according to claim 1, wherein the capacitive fingerprint identification apparatus is configured to be arranged in aside surface of the electronic device.

11. The capacitive fingerprint identification apparatus according to claim 1, wherein, the capacitive fingerprint identification apparatus is arranged on a target key of the electronic device, the target key is arranged on a side surface of the electronic device, and the target key is configured to realize a target function and a fingerprint identification function.

12. An electronic device having a capacitive fingerprint identification apparatus arranged in a side arc-shaped surface thereof, the electronic device comprising:
  a capacitive fingerprint identification package structure;
  an arc surface structure, comprising a first surface and a second surface, wherein the first surface of the arc surface structure is a plane, the second surface of the arc surface structure is an arc surface, and the first surface of the arc surface structure is connected to a first surface of the capacitive fingerprint identification package structure, and the first surface of the capacitive fingerprint identification package structure is a surface facing the outside of the electronic device, wherein a material of the arc surface structure is a high temperature resistant ultraviolet (UV) light glue, and a dielectric constant of the arc surface structure is greater than 3.4.

13. The electronic device according to claim 12, wherein the capacitive fingerprint identification apparatus is provided on a target key of the electronic device, the target key is provided on a side surface of the electronic device, and the target key is configured to realize a target function and a fingerprint identification function.

14. The electronic device according to claim 13, wherein the target key is a power key of an electronic device.

* * * * *